(12) United States Patent
Li et al.

(10) Patent No.: US 12,342,642 B2
(45) Date of Patent: Jun. 24, 2025

(54) IMAGE SENSOR WITH IMAGE RECEIVER AND AUTOMATIC IMAGE SWITCHING

(71) Applicant: CISTA SYSTEM CORP., Grand Cayman (KY)

(72) Inventors: Zhaojian Li, Fremont, CA (US); Jiangtao Pang, Fremont, CA (US)

(73) Assignee: Cista System Corp., Grand Cayman (KY)

( * ) Notice: Subject to any disclaimer, the term of this patent is extended or adjusted under 35 U.S.C. 154(b) by 0 days.

(21) Appl. No.: 18/745,705

(22) Filed: Jun. 17, 2024

(65) Prior Publication Data

US 2024/0339465 A1    Oct. 10, 2024

Related U.S. Application Data

(63) Continuation of application No. 18/383,399, filed on Oct. 24, 2023, now Pat. No. 12,119,357, which is a continuation of application No. 18/086,074, filed on Dec. 21, 2022, now Pat. No. 11,843,006, which is a continuation of application No. 17/679,495, filed on Feb. 24, 2022, now Pat. No. 11,569,276, which is a continuation of application No. 17/130,371, filed on Dec. 22, 2020, now Pat. No. 11,322,531, which is a continuation of application No. 16/251,239, filed on Jan. 18, 2019, now Pat. No. 10,892,287.

(51) Int. Cl.
*H10F 39/00*    (2025.01)

(52) U.S. Cl.
CPC ......... *H10F 39/8023* (2025.01); *H10F 39/80* (2025.01)

(58) Field of Classification Search
CPC ......... H01L 27/14605; H01L 27/14806; H01L 27/14603; H04N 5/2258; H04N 23/45; G03B 15/00; H04M 1/0264
See application file for complete search history.

(56) References Cited

U.S. PATENT DOCUMENTS 6,429,898 B1    8/2002  Shoda et al.
6,639,626 B1 *  10/2003 Kubo ................... H04N 23/667
                                                        348/222.1

(Continued)

OTHER PUBLICATIONS

Non-Final Office Action dated Mar. 26, 2020, issued in related U.S. Appl. No. 16/251,239 (14 pages).

(Continued)

*Primary Examiner* — Chiawei Chen
(74) *Attorney, Agent, or Firm* — Sheppard Mullin Richter & Hampton LLP

(57) ABSTRACT

Provided are an image sensor with one or more image receivers for image switching, and an imaging system and method therefor. The image sensor includes an image sensor array to generate first image data for a first image; a receiver to receive, into the image sensor, second image data for a second image; an image selection circuit coupled to the image sensor array and the receiver to receive the first image data and the second image data and select one of the first image data and the second image data according to one or more image selection criteria and at least one of the first image data and the second image data; and a transmitter coupled to the image selection circuit to transmit the selected one of the first image data and the second image data from the image sensor.

20 Claims, 4 Drawing Sheets

(56) References Cited

U.S. PATENT DOCUMENTS

| | | | |
|---|---|---|---|
| 7,436,451 B2* | 10/2008 | Sato | H04N 23/45 348/246 |
| 7,965,314 B1 | 6/2011 | Miller et al. | |
| 8,520,105 B2* | 8/2013 | Funatsu | H10F 39/813 348/311 |
| 9,568,713 B2 | 2/2017 | Laroia | |
| 9,594,434 B1 | 3/2017 | Neglur | |
| 10,291,903 B2* | 5/2019 | Sasada | G03B 35/08 |
| 10,506,147 B2* | 12/2019 | Malone | H04N 25/771 |
| 11,353,691 B1 | 6/2022 | Harfouche et al. | |
| 2001/0011736 A1* | 8/2001 | Dierickx | H04N 25/585 257/E27.128 |
| 2003/0020814 A1 | 1/2003 | Ono | |
| 2004/0169587 A1 | 9/2004 | Washington | |
| 2004/0239783 A1 | 12/2004 | Imaizumi et al. | |
| 2007/0024737 A1 | 2/2007 | Nakamura et al. | |
| 2007/0188650 A1 | 8/2007 | Kobayashi et al. | |
| 2007/0242860 A1 | 10/2007 | Hasebe et al. | |
| 2008/0218611 A1 | 9/2008 | Parulski et al. | |
| 2008/0218612 A1 | 9/2008 | Border et al. | |
| 2008/0218613 A1 | 9/2008 | Janson et al. | |
| 2008/0219654 A1 | 9/2008 | Border et al. | |
| 2010/0194918 A1 | 8/2010 | Zhang et al. | |
| 2011/0149116 A1 | 6/2011 | Kim | |
| 2011/0205209 A1 | 8/2011 | Kurokawa et al. | |
| 2012/0200734 A1 | 8/2012 | Tang | |
| 2013/0162873 A1 | 6/2013 | Sengoku et al. | |
| 2015/0015479 A1 | 1/2015 | Cho | |
| 2015/0054973 A1 | 2/2015 | Velichko | |
| 2015/0124125 A1 | 5/2015 | Kim et al. | |
| 2016/0037101 A1 | 2/2016 | Shim et al. | |
| 2017/0126966 A1 | 5/2017 | Cheng | |
| 2017/0142312 A1 | 5/2017 | Dal Mutto et al. | |
| 2017/0180614 A1 | 6/2017 | Ollila | |
| 2017/0289466 A1 | 10/2017 | Ge et al. | |
| 2018/0295292 A1* | 10/2018 | Lee | H04N 23/67 |
| 2019/0204572 A1 | 7/2019 | Hermalyn | |
| 2019/0228512 A1 | 7/2019 | Kurihara et al. | |
| 2020/0036881 A1 | 1/2020 | Asoma | |
| 2020/0077031 A1 | 3/2020 | Lee et al. | |
| 2020/0077033 A1 | 3/2020 | Chan et al. | |
| 2021/0075988 A1 | 3/2021 | Ko et al. | |
| 2021/0227139 A1 | 7/2021 | Wang et al. | |
| 2021/0334581 A1 | 10/2021 | Gandara et al. | |
| 2022/0038648 A1* | 2/2022 | Iida | H10F 39/8023 |

OTHER PUBLICATIONS

Notice of Allowance mailed Sep. 10, 2020, issued in related U.S. Appl. No. 16/251,239 (12 pages).

Non-Final Office Action dated Jul. 28, 2021, issued in related U.S. Appl. No. 17/130,371 (16 pages).

Notice of Allowance dated Jan. 5, 2022, issued in related U.S. Appl. No. 17/130,371 (9 pages).

Notice of Allowance dated Sep. 28, 2022, issued in related U.S. Appl. No. 17/679,495 (9 pages).

Notice of Allowance dated Aug. 4, 2023, issued in related U.S. Appl. No. 18/086,074 (9 pages).

Notice of Allowance mailed May 28, 2024, issued in related U.S. Appl. No. 18/383,399 (9 pages).

* cited by examiner

IMAGE SENSOR WITH IMAGE RECEIVER AND AUTOMATIC IMAGE SWITCHING

CROSS REFERENCE TO RELATED APPLICATIONS

The present application is a continuation of U.S. patent application Ser. No. 18/383,399, filed Oct. 24, 2023, which is a continuation of U.S. patent application Ser. No. 18/086,074, filed Dec. 21, 2022, now U.S. Pat. No. 11,843,006, entitled "IMAGE SENSOR WITH IMAGE RECEIVER AND AUTOMATIC IMAGE SWITCHING," which is a continuation of U.S. patent application Ser. No. 17/679,495, filed Feb. 24, 2022, now U.S. Pat. No. 11,569,276, entitled "IMAGE SENSOR WITH IMAGE RECEIVER AND AUTOMATIC IMAGE SWITCHING," which is a continuation of U.S. patent application Ser. No. 17/130,371, filed Dec. 22, 2020, now U.S. Pat. No. 11,322,531, entitled "IMAGE SENSOR WITH IMAGE RECEIVER AND AUTOMATIC IMAGE SWITCHING," which is a continuation of U.S. patent application Ser. No. 16/251,239, filed Jan. 18, 2019, now U.S. Pat. No. 10,892,287, entitled "IMAGE SENSOR WITH IMAGE RECEIVER AND AUTOMATIC IMAGE SWITCHING." The disclosures of all of the above-referenced applications are incorporated by reference herein in their entirety.

TECHNICAL FIELD

The present disclosure generally relates to the field of solid-state image sensor arrays, particularly to solid-state image sensor arrays having receivers for receiving additional images.

BACKGROUND

Digital cameras, scanners, and other imaging devices often use image sensors, such as charge-coupled device (CCD) image sensors or complementary metal-oxide-semiconductor (CMOS) image sensors, to convert optical signals to electrical signals for storage, processing, display, and the like. Recently, imaging devices have begun to include multiple image sensors, for example to capture images using multiple spectra, multiple subjects, and the like.

SUMMARY

In general, one aspect disclosed features an imaging system comprising: an image sensor comprising a first image sensor array to generate first image data for a first image, a receiver to receive, into the image sensor, second image data for a second image, an image selection circuit coupled to the first image sensor array and the receiver to receive the first image data and the second image data and select one of the first image data and the second image data according to one or more image selection criteria, and at least one of the first image data and the second image data, and a transmitter coupled to the image selection circuit to transmit the selected one of the first image data and the second image data from the image sensor; and a second image sensor array coupled to the image sensor to generate the second image data for the second image.

Embodiments of the imaging system may include one or more of the following features. Some embodiments comprise an image signal processor to process the selected one of the first image data and the second image data into a processed image. Some embodiments comprise a display to display the processed image. In some embodiments, the first image and the second image are captured substantially concurrently. In some embodiments, the first and second image sensor arrays possess different image capture characteristics, wherein the image capture characteristics include at least one of: pixel size; sensitivity; read noise; gain; exposure time; and spectrum. In some embodiments, the one or more image selection criteria include at least one of: noise; dynamic range; resolution; brightness; a quantity of features; a quality of features; a presence of text; facial recognition; and facial expression recognition. In some embodiments, the receiver is a Mobile Industry Processor Interface (MIPI) receiver; and the transmitter is a MIPI transmitter.

In general, one aspect disclosed features an image sensor comprising: an image sensor array to generate first image data for a first image; a receiver to receive, into the image sensor, second image data for a second image; an image selection circuit coupled to the image sensor array and the receiver to receive the first image data and the second image data and select one of the first image data and the second image data according to one or more image selection criteria and at least one of the first image data and the second image data; and a transmitter coupled to the image selection circuit to transmit the selected one of the first image data and the second image data from the image sensor.

Embodiments of the image sensor may include one or more of the following features. In some embodiments, the first image and the second image are captured substantially concurrently. In some embodiments, the first image includes a scene; and the second image includes the scene. In some embodiments, the image sensor array generating the first image data for the first image, and an image sensor capturing the second image, possess different image capture characteristics, wherein the image capture characteristics include at least one of: pixel size; sensitivity; read noise; gain; exposure time; and spectrum. In some embodiments, the one or more image selection criteria include at least one of: noise; dynamic range; resolution; brightness; a quantity of features; a quality of features; a presence of text; facial recognition; and facial expression recognition. In some embodiments, the receiver is a Mobile Industry Processor Interface (MIPI) receiver; and the transmitter is a MIPI transmitter. Some embodiments comprise a single integrated circuit comprising the image sensor.

In general, one aspect disclosed features a method for an image sensor, the method comprising: generating, in an image sensor array of the image sensor, first image data for a first image, responsive to receiving light; receiving into the image sensor, second image data for a second image; selecting one of the first image data and the second image data according to one or more image selection criteria and at least one of the first image data and the second image data; and transmitting the selected one of the first image data and the second image data from the image sensor.

Embodiments of the method may include one or more of the following features. In some embodiments, the first image and the second image are captured substantially concurrently. In some embodiments, the first image includes a scene; and the second image includes the scene. In some embodiments, the image sensor array generating the first image data for the first image, and an image sensor array capturing the second image, possess different characteristics, wherein the characteristics include at least one of: pixel size; sensitivity; read noise; gain; exposure time; and spectrum. In some embodiments, the one or more image selection criteria include at least one of: noise; dynamic range;

resolution; brightness; a quantity of features; a quality of features; a presence of text; facial recognition; and facial expression recognition. In some embodiments, the second image is received according to a Mobile Industry Processor Interface (MIPI) specification; and the selected image is transmitted according to the MIPI specification.

BRIEF DRAWINGS DESCRIPTION

The present disclosure describes various embodiments that may be understood and fully appreciated in conjunction with the following drawings.

DETAILED DESCRIPTION

Figure 1:
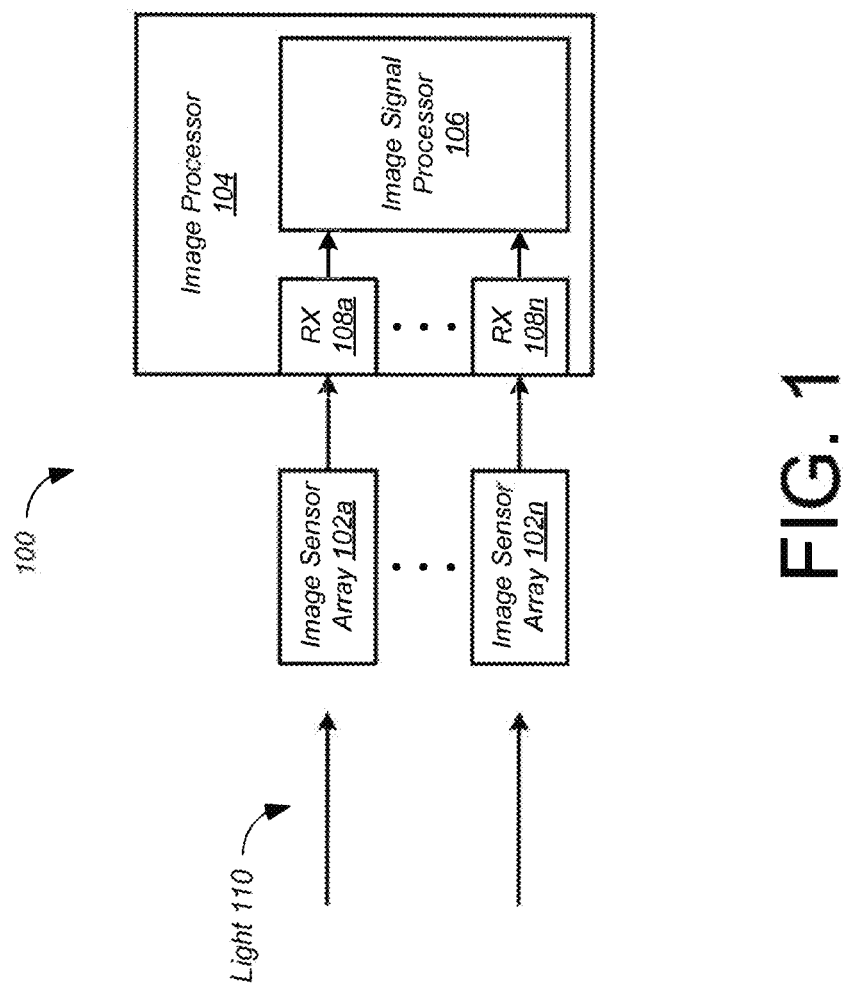
FIG. 1 illustrates a conventional imaging system using multiple image sensor arrays.

The present disclosure describes embodiments with reference to the drawing figures listed above. Persons of ordinary skill in the art will appreciate that the description and figures illustrate rather than limit the disclosure and that, in general, the figures are not drawn to scale for clarity of presentation. Such skilled persons will also realize that many more embodiments are possible by applying the inventive principles contained herein and that such embodiments fall within the scope of the disclosure which is not to be limited except by the claims.

FIG. 1 illustrates a conventional imaging system using multiple image sensor arrays. Referring to FIG. 1, the imaging system 100 includes a plurality of image sensor arrays 102a through 102n, and an image processor 104. Each image sensor array 102 generates image data responsive to receiving light 110, for example such as light reflected by, or radiated by, a subject. The image processor 104 includes an image signal processor 106 for processing the image data generated by the image sensor arrays 102. In the conventional imaging system 100 of FIG. 1, the image processor 104 must include multiple receivers (RX) 108a through 108n to receive the image data from the multiple image sensor arrays 102a through 102n. In particular, the image processor 104 must include a separate receiver 108 for each image sensor array 102.

Figure 2:
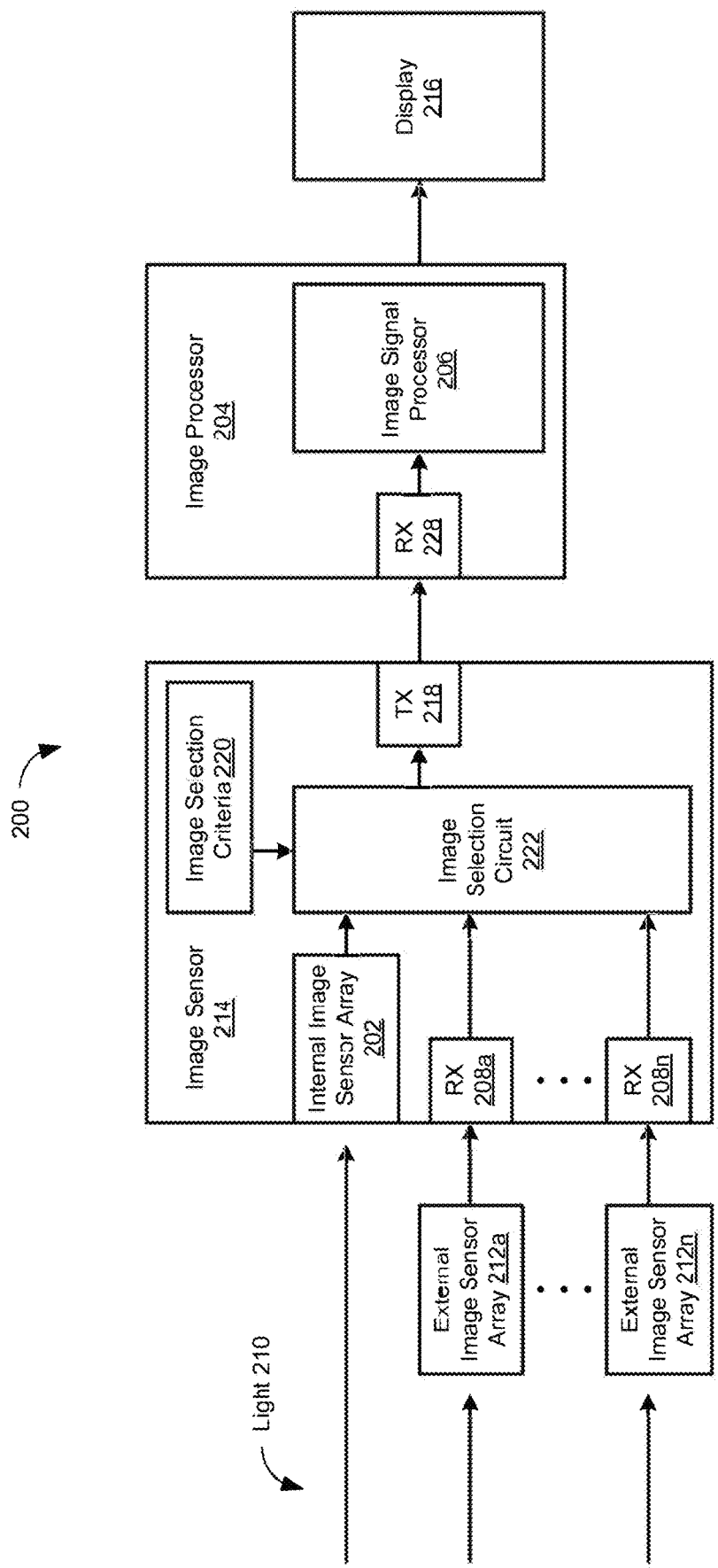
FIG. 2 illustrates an imaging system that includes an image sensor having an image data receiver and automatic image switching according to the technology disclosed herein.

FIG. 2 illustrates an imaging system that includes an image sensor having an image data receiver and automatic image switching according to the technology disclosed herein. Referring to FIG. 2, the imaging system 200 includes an image sensor 214, an image processor 204, a display 216, and one or more external image sensor arrays 212a through 212n. The external image sensor arrays 212a through 212n are referred to herein as "external" because they are external to the image sensor 214. The image processor 204 includes an image signal processor 206, and a single receiver 228. The image sensor 214 includes an internal image sensor array 202, one or more receivers 208a through 208n, a single transmitter (TX) 218, an image selection circuit 222, and image selection criteria 220. The image sensor 214 may be fabricated as a single integrated circuit. The image sensor arrays 202, 212 may be fabricated using any suitable technology. For example, the image sensor arrays 202, 212 may be fabricated as arrays of CMOS CCDs. The image sensor arrays 202, 212 may all be fabricated using the same technology, or using different technologies. In some embodiments, each receiver 208, 228 is a Mobile Industry Processor Interface (MIPI) receiver, and transmitter 218 is a MIPI transmitter. That is, receivers 208, 228 and transmitter 218 operate according to a MIPI specification. But in other embodiments, receivers 208, 228 and transmitter 218 may operate according to other specifications.

Figure 3:
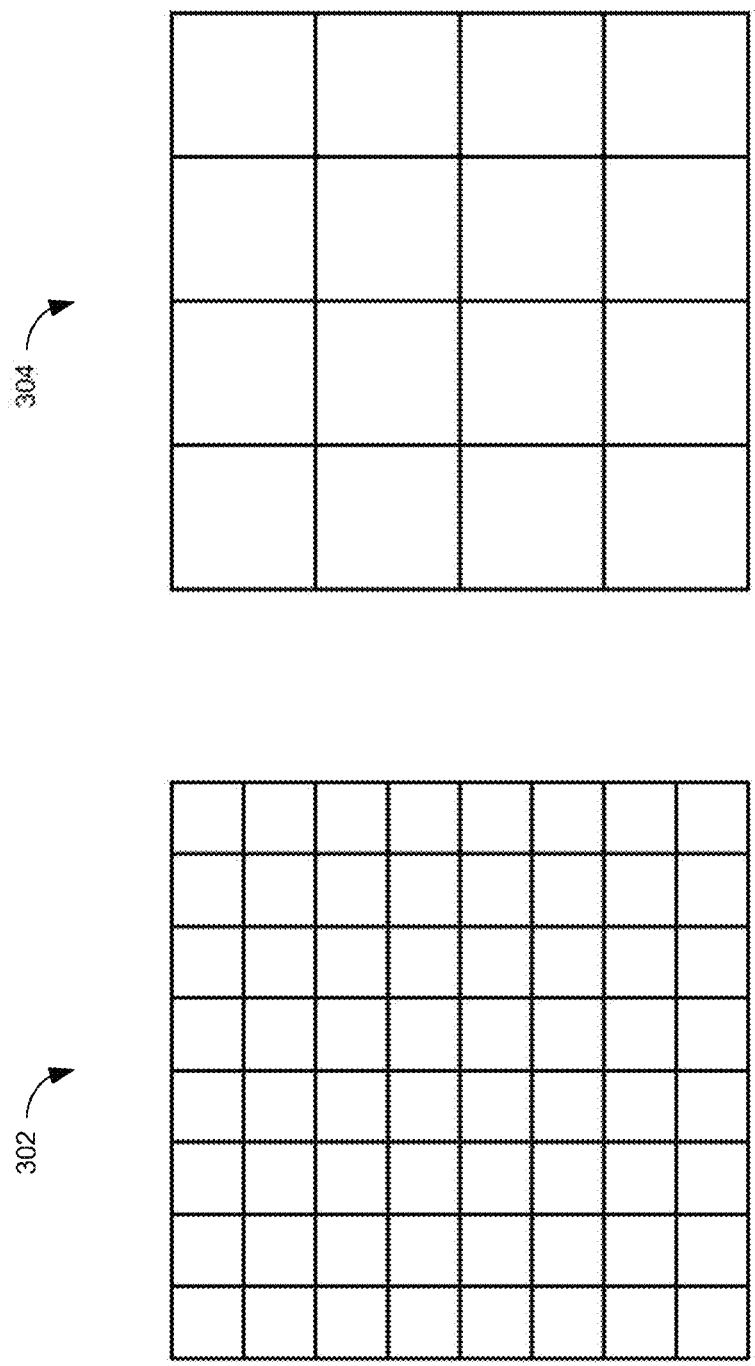
FIG. 3 illustrates two image sensor arrays having the same optical format but different image capture characteristics.

In some embodiments, while the image sensor arrays 202, 212 may have the same optical format, one or more of the image sensor arrays 202, 212 may possess different image capture characteristics. These image capture characteristics may include, for example, pixel size, sensitivity, read noise, gain, exposure time, spectrum, other image capture characteristics, any combination thereof, and the like. FIG. 3 illustrates two image sensor arrays having the same optical format but different image capture characteristics. Referring to FIG. 3, two image sensor arrays 302, 304 are illustrated. Both image sensor arrays 302, 304 have the same optical format. That is, both image sensor arrays 302, 304 have the same size and shape. However, the image sensor arrays 302, 304 have different pixel sizes. In particular, the pixels of the image sensor array 304 are four times as large as the pixels of the image sensor array 302.

By having multiple image sensor arrays 202, 212 with different image capture characteristics, an image of a scene may be selected from among multiple images having different qualities. In the example of FIG. 3, the image sensor array 304 having larger pixel size will possess higher sensitivity, and less read noise, than the image sensor array 302 having smaller pixel size. Accordingly, for dark scenes, the image produced by the image sensor array 304 having larger pixel sizes will have a higher quality than the image produced by the image sensor array 302 having smaller pixel size. The image sensor array 302 having smaller pixel size will have higher resolution and a large charge handling capacity, meaning the pixels are not as easily saturated. The image sensor array 302 having smaller pixel size therefore will produce a higher quality image for a well lit scene than the image produced by the image sensor array 304 having larger pixel sizes. To further optimize these image sensor arrays 302, 304 for light and dark scenes, the image sensor array 302 having smaller pixel size may be implemented with a longer exposure, while the image sensor array 304 having larger pixel sizes may be implemented with a shorter exposure.

Referring again to FIG. 2, responsive to receiving light 210, the internal image sensor array 202 may generate image data, and may be coupled to the image selection circuit 222 to provide that generated image data to the image selection circuit 222. Similarly, each external image sensor array 212 may generate image data responsive to receiving the light 210. Each external image sensor array 212 may provide its image data to a corresponding receiver 208 within the image sensor 214. The receivers 208a through 208n may receive the image data into the image sensor 214, and may be coupled to the image selection circuit 222 to provide that received image data to the image selection circuit 222. In accordance with the image selection criteria 220, the image selection circuit 222 may select one of the images captured by the image sensor arrays 202, 212. The image selection circuit 222 may be coupled to the transmitter 218 to provide the image data for the selected image to the transmitter 218, which may transmit the image data from the image sensor 214.

The receiver 228 of the image processor 204 may receive the data for the selected image into the image processor 204, and may provide the image data to the image signal processor 206. The image signal processor 206 may process the image data according to any image processing algorithm. The image processor 204 may provide the processed image data to the display 216, which may display the processed selected image in accordance with the processed image data.

Embodiments of the disclosed technology feature several advantages. Compared with the conventional implementation of FIG. 1, the disclosed technology, for example as shown in FIG. 2, requires only one receiver to be implemented within the image processor 204. Fewer receivers means fewer data lines, fewer clock lines, and the like, thereby decreasing the complexity and cost of the image processor 204. Furthermore, the image selection function implemented by the image selection circuit 222 is now performed outside the image processor 204, further reducing the complexity and cost of the image processor 204. Using image sensor arrays 202, 212 configured to capture lights of differing spectra features advantages as well. For example, an infrared image sensor array may produce an image showing structural features that differ from those in an image produced by a visible light image sensor array. The image selection circuit 222 may select the image having the most useful features, for example for facial recognition in a high security environment.

Figure 4:
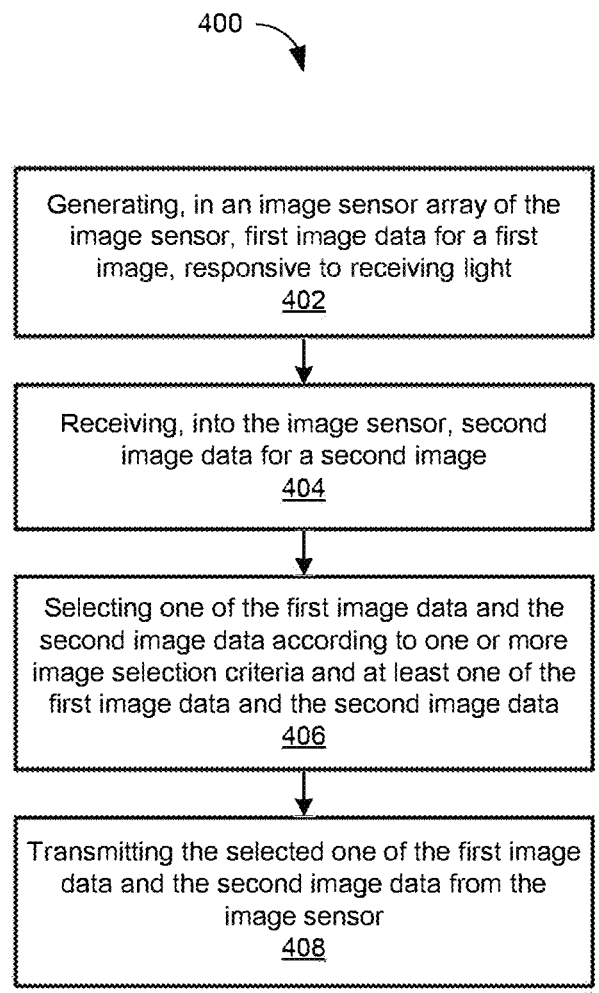
FIG. 4 illustrates a process that may be performed by the imaging system of FIG. 2 according to embodiments of the disclosed technology.

FIG. 4 illustrates a process that may be performed by the imaging system 200 of FIG. 2 according to embodiments of the disclosed technology. Although elements of the process are depicted in a certain sequence, in other embodiments the elements may be performed in other sequences, concurrently, or any combination thereof. In some embodiments, one or more elements may be omitted. Referring to FIG. 4, the process 400 may include generating, in the internal image sensor array 202 of the image sensor 214, first image data for a first image, responsive to receiving the light 210, at 402.

The process 400 may include receiving, into the image sensor 214, second image data for a second image, at 404. The second image data may be generated by one or more of the external image sensor arrays 212. The internal and external image sensor arrays 202, 212 may capture images substantially concurrently. For example, each captured image may correspond to a frame in a sequence of frames, and the image sensor arrays 202, 212 may have the same frame rate and phase. The images may be of the same subject, or of different subjects. The images may include the same scene, or different scenes.

The process 400 may include selecting one of the first image data and the second image data according to one or more image selection criteria 220, and at least one of the first image data in the second image data, at 406. The image selection criteria 220 may include, for example, noise, dynamic range, resolution, brightness, a quantity of features, a quality of features, a presence of text, facial recognition, facial expression recognition, other image selection criteria, any combination thereof, and the like. Process 400 may include transmitting the selected one of the first image data and the second image data from the image sensor 214, at 408.

In some embodiments, the imaging system 200 of FIG. 2 may be implemented within an automobile, with the display 216 visible to the driver and/or passengers, and with multiple image sensor arrays 202, 212 capturing images of scenes ahead of the vehicle. In bright daylight, the image selection circuit 222 may select an image produced by an image sensor array 202, 212 having small pixel size, low resolution, low gain, and longer exposure time. But as the vehicle enters a dark tunnel, the image selection circuit 222 may select an image produced by an image sensor array 202, 212 having large pixel size, high resolution, high gain, and shorter exposure time.

Continuing the example with the imaging system 200 of FIG. 2 implemented within an automobile, while some of the image sensor arrays 202, 212 may be arranged to capture images of scenes ahead of the vehicle, another image sensor array 202 may be arranged to capture images of an infant in the back seat of vehicle. While the images of the scenes ahead of the vehicle may be selected by default, the scene of the infant may be selected according to facial expression recognition criteria when the face of the infant exhibits distress.

It will also be appreciated by persons of ordinary skill in the art that the present disclosure is not limited to what has been particularly shown and described hereinabove. Rather, the scope of the present disclosure includes both combinations and sub-combinations of the various features described hereinabove as well as modifications and variations which would occur to such skilled persons upon reading the foregoing description. Thus the disclosure is limited only by the appended claims.

The invention claimed is:

1. An imaging system comprising:
an image sensor comprising:
a first image sensor array to generate first image data for a first image, the first image sensor array having a first sensitivity,
a receiver to receive, into the image sensor, second image data for a second image,
an image selection circuit coupled to the first image sensor array and the receiver to receive the first image data and the second image data and select one of the first image data and the second image data according to one or more image selection criteria, and at least one of the first image data and the second image data, and
a transmitter coupled to the image selection circuit to transmit the selected one of the first image data and the second image data from the image sensor; and
a second image sensor array coupled to the image sensor to generate the second image data for the second image, the second image sensor array having a second sensitivity, wherein the first and second sensitivities are different, and wherein the second image sensor array is external to the image sensor.

2. The imaging system of claim 1, further comprising:
an image signal processor to process the selected one of the first image data and the second image data into a processed image.

3. The imaging system of claim 2, further comprising:
a display to display the processed image.

4. The imaging system of claim 1, wherein:
the first image and the second image are captured substantially concurrently.

5. The imaging system of claim 1, wherein the first and second image sensor arrays possess other different image capture characteristics, wherein the image capture characteristics include at least one of:
pixel size;
capture gain;
read noise;
exposure time; and
spectrum.

6. The imaging system of claim 1, wherein the one or more image selection criteria include at least one of:
   noise;
   dynamic range;
   resolution;
   brightness;
   a quantity of features;
   a quality of features;
   a presence of text;
   facial recognition; and
   facial expression recognition.

7. The imaging system of claim 1, wherein:
   the receiver is a Mobile Industry Processor Interface (MIPI) receiver; and
   the transmitter is a MIPI transmitter.

8. An image sensor comprising:
   a first image sensor array to generate first image data for a first image, the first image sensor array having a first sensitivity;
   a receiver to receive, into the image sensor, second image data captured by a second image sensor array for a second image, the second image sensor array having a second sensitivity, wherein the first and second sensitivities are different, and wherein the second image sensor array is external to the image sensor;
   an image selection circuit coupled to the first image sensor array and the receiver to receive the first image data and the second image data and select one of the first image data and the second image data according to one or more image selection criteria and at least one of the first image data and the second image data; and
   a transmitter coupled to the image selection circuit to transmit the selected one of the first image data and the second image data from the image sensor.

9. The image sensor of claim 8, wherein:
   the first image and the second image are captured substantially concurrently.

10. The image sensor of claim 9, wherein:
    the first image includes a scene; and
    the second image includes the scene.

11. The image sensor of claim 8, wherein the first image sensor array generating the first image data for the first image, and the second image sensor capturing the second image, possess different image capture characteristics, wherein the image capture characteristics include at least one of:
    pixel size;
    capture gain;
    read noise;
    exposure time; and
    spectrum.

12. The image sensor of claim 8, wherein the one or more image selection criteria include at least one of:
    noise;
    dynamic range;
    resolution;
    brightness;
    a quantity of features;
    a quality of features;
    a presence of text;
    facial recognition; and
    facial expression recognition.

13. The image sensor of claim 8, wherein:
    the receiver is a Mobile Industry Processor Interface (MIPI) receiver; and
    the transmitter is a MIPI transmitter.

14. A single integrated circuit comprising the image sensor of claim 8.

15. A method for an image sensor, the method comprising:
    generating, in a first image sensor array of the image sensor, first image data for a first image, responsive to receiving light, the first image sensor array having a first sensitivity;
    receiving into the image sensor, second image data for a second image captured by a second image sensor array, the second image sensor array having a second sensitivity, wherein the first and second sensitivities are different, and wherein the second image sensor array is external to the image sensor;
    selecting one of the first image data and the second image data according to one or more image selection criteria and at least one of the first image data and the second image data; and
    transmitting the selected one of the first image data and the second image data from the image sensor.

16. The method of claim 15, wherein:
    the first image and the second image are captured substantially concurrently.

17. The method of claim 16, wherein:
    the first image includes a scene; and
    the second image includes the scene.

18. The method of claim 15, wherein the first image sensor array generating the first image data for the first image, and the second image sensor array capturing the second image, possess different characteristics, wherein the characteristics include at least one of:
    pixel size;
    capture gain;
    read noise;
    exposure time; and
    spectrum.

19. The method of claim 15, wherein the one or more image selection criteria include at least one of:
    noise;
    dynamic range;
    resolution;
    brightness;
    a quantity of features;
    a quality of features;
    a presence of text;
    facial recognition; and
    facial expression recognition.

20. The method of claim 15, wherein:
    the second image is received according to a Mobile Industry Processor Interface (MIPI) specification; and
    the selected image is transmitted according to the MIPI specification.

* * * * *